United States Patent
Rauch

(10) Patent No.: US 6,901,997 B2
(45) Date of Patent: Jun. 7, 2005

(54) THERMAL INTERFACE WAFER AND METHOD OF MAKING AND USING THE SAME

(75) Inventor: Robert A. Rauch, Lake Forest, CA (US)

(73) Assignee: Loctite Corporation, Rock Hill, CT (US)

( * ) Notice: Subject to any disclaimer, the term of this patent is extended or adjusted under 35 U.S.C. 154(b) by 117 days.

(21) Appl. No.: 10/669,813

(22) Filed: Sep. 24, 2003

(65) Prior Publication Data

US 2004/0069452 A1 Apr. 15, 2004

Related U.S. Application Data

(62) Division of application No. 09/876,763, filed on Jun. 7, 2001, now Pat. No. 6,672,378.

(51) Int. Cl.$^7$ .............................................. H05K 7/20
(52) U.S. Cl. ........................................ 165/185; 361/705
(58) Field of Search .......................... 165/185; 361/705

(56) References Cited

U.S. PATENT DOCUMENTS

| 2,799,793 A | 7/1957 | De Cain |
| 2,887,628 A | 5/1959 | Zierdt, Jr. |
| 3,013,104 A | 12/1961 | Young |
| 3,249,680 A | 5/1966 | Sheets et al. |
| 3,356,828 A | 12/1967 | Furness |

(Continued)

FOREIGN PATENT DOCUMENTS

| CA | 600823 | 6/1960 |
| FR | 2368529 | 10/1976 |
| GB | 1086003 | 10/1967 |

OTHER PUBLICATIONS

"Thermal Properties of Materials", webpage located at: http://www.ai.mit.edu/people/tk/tks/tcon.html, dated Sep. 6, 1994.*
Power Devices, Inc.: "Kapton MT Substrates Coated with High Performance Thermal Compound in Easy–to–Use Form"; MCM–Strate; 1996.
Power Devices, Inc.; "Low Thermal Resistance and Excellent Electrical Insulation in One Clean, Reliable System"; ISOSTRATE: 1991.
Power Devices, Inc.; "Adhesive–backed Aluminum Substrate with High Performance Thermal Compound in Easy–to–Use Form"; MCM–STRATE; 1996.
Power Devices, Inc.; The Cost–Effective Soulution to Thermal Interface Problems—Clean, Dry and Easy to Use; THERMSTRATE; 1991.
Chomerics; "THERMATTACH 404 and 405 Thermally Conductive Adhesive Tapes"; CHO–THERM Thermal Interface Materials; Technical Bulletin 72; 1993.

(Continued)

*Primary Examiner*—Allen J. Flanigan
(74) *Attorney, Agent, or Firm*—Stetina Brunda Garred & Drucker

(57) ABSTRACT

A thermal interface wafer for facilitating heat transfer from an electronic component to a heat sink. The wafer is formed from at least one elongate, vertically-oriented strip of thermally conductive material having a layer of conformable, heat-conducting material formed thereon. Preferably, the substrate comprises a metal foil, such as aluminum or some other thermally-conductive metal, that is formed as a flat, spiral-like coil. Such strip may further be configured to have a serpentine configuration, or may alternatively be formed from a multiplicity of strips. The present invention further provides for methods of transferring heat from an electronic component to a heat sink, as well as methods for fabricating the thermal interface wafers of the present invention.

6 Claims, 3 Drawing Sheets

U.S. PATENT DOCUMENTS

| | | |
|---|---|---|
| 3,391,242 A | 7/1968 | Sudges |
| 3,463,140 A | 8/1969 | Rollor, Jr. |
| 3,463,151 A | 8/1969 | Andrassy |
| 3,467,547 A | 9/1969 | Harvey et al. |
| 3,476,177 A | 11/1969 | Potzl |
| 3,586,102 A | 6/1971 | Gilles |
| 3,603,106 A | 9/1971 | Ryan |
| 3,819,530 A | 6/1974 | Ratledge et al. |
| 3,823,089 A | 7/1974 | Ryan et al. |
| 3,887,628 A | 6/1975 | Beckers |
| 3,972,821 A | 8/1976 | Weidenbenner et al. |
| 4,065,908 A | 1/1978 | Mueller |
| 4,139,051 A | 2/1979 | Jones et al. |
| 4,151,547 A | 4/1979 | Rhoades et al. |
| 4,199,548 A | 4/1980 | Raiho et al. |
| 4,237,086 A | 12/1980 | Gehle |
| 4,266,267 A | 5/1981 | Ruegg |
| 4,299,715 A | 11/1981 | Whitfield et al. |
| 4,360,626 A | 11/1982 | Manwiller |
| 4,466,483 A | 8/1984 | Whitfield et al. |
| 4,473,113 A | 9/1984 | Whitfield et al. |
| 4,489,487 A | 12/1984 | Bura |
| 5,002,715 A | 3/1991 | Grapes et al. |
| 5,051,259 A * | 9/1991 | Olsen et al. ............... 424/443 |
| 5,060,114 A | 10/1991 | Feinberg et al. |
| 5,237,086 A | 8/1993 | Kruger et al. |
| 5,660,917 A * | 8/1997 | Fujimori et al. ............ 165/185 |
| 5,783,862 A * | 7/1998 | Deeney ................ 165/104.17 |
| 5,904,796 A | 5/1999 | Freuler et al. |
| 5,912,805 A | 6/1999 | Freuler et al. |
| 5,930,715 A | 7/1999 | Chambers |
| 5,931,831 A | 8/1999 | Linder |
| 5,986,884 A | 11/1999 | Jairazbhoy et al. |
| 6,037,659 A * | 3/2000 | Weixel ...................... 257/717 |
| 6,054,198 A * | 4/2000 | Bunyan et al. ............. 156/247 |
| 6,391,442 B1 * | 5/2002 | Duvall et al. ............... 427/218 |

OTHER PUBLICATIONS

Chomerics; "THERMATACH T413 and T414 Thermally Conductive Adhesive Tapes"; Preliminary Product Data Sheet; 1994.

Chomerics; "THERMFLOW T705 and T710 Low Thermal Resistance Interface Pads"; CHO–THERM Thermal Interface Material; Technical Bulletin 77; 1997.

The Bergquist Company; "SIL–PAD Design Guide"; Spring 1993.

* cited by examiner

THERMAL INTERFACE WAFER AND METHOD OF MAKING AND USING THE SAME

CROSS-REFERENCE TO RELATED APPLICATIONS

The present application is a divisional of U.S. patent application Ser. No. 09/876,763, filed Jun. 7, 2001 entitled Thermal Interface now in the issuance process, now U.S. Pat. No. 6,672,378.

BACKGROUND OF THE INVENTION

Methods and materials for transferring heat across the interface between a heat-dissipating component, which typically includes various electronic components in semiconductor devices, to an external heat dissipater or heat sink are well-known in the art. In this regard, the electronic component generates substantial heat which can cause the component to fail catastrophically. Even to the extent the component does not fail, such elevated temperatures can and frequently do affect the component's electrical characteristics and can cause intermittent or permanent changes. Indeed, the life of an electronic component is directly related to its operating temperature, and a temperature rise of so much as 10° C. can reduce the component's life by 50%. On the other hand, a corresponding decrease in 10° C. can increase a component's life by 100%.

According to contemporary methodology, the typical solution to such heat dissipation problems is to provide an external heat dissipater or heat sink coupled to the electronic device. Such heat sink ideally provides a heat-conductive pathway from the heat dissipating component to outwardly extending structures such as fins or other protuberances having sufficient surface area to dissipate the heat into the surrounding air. To facilitate such heat dissipation, a fan is frequently utilized to provide adequate air circulation over the fins or protuberances.

However, essential to any effective system for removing heat from an electronic component to a heat sink requires efficient and uniform heat transfer at the interface between the component and the heat sink. Among the more efficient means by which heat is transferred across the interface between the component and the heat sink has been the use of heat conductive pads. Such heat conductive pads are typically pre-formed to have a shape or footprint compatible with a particular electronic component and/or heat sink, such that a given pad may be easily applied thereto prior to coupling the heat sink to the electronic component.

Exemplary of such contemporary phase change pad-type thermal interface products are THERMSTRATE; ISOSTRATE and POWERSTATE (each registered trademarks of Power Devices, Inc. of Laguna Hills, Calif.). The THERMSTRATE interface comprises thermally conductive, die-cut pads which are placed intermediate the electronic component and the heat sink so as to enhance heat conduction there between. The THERMSTRATE heat pads comprise a durable-type 1100 or 1145 aluminum alloy substrate having a thickness of approximately 0.002 inch (although other aluminum and/or copper foil thickness may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase change insofar as the compound is dry at room temperature, yet liquefies just below the operating temperature of the great majority of electronic components, which is typically around 50° C. or higher, so as to assure desired heat conduction. When the electronic component is no longer in use (i.e., is no longer dissipating heat), such thermally conductive compound resolidifies once the same cools to room temperature.

The ISOSTRATE thermal interface is likewise a die-cut mounting pad and utilizes a heat conducting polyamide substrate, namely, KAPTON (a registered trademark of DuPont) type MT. The ISOSTRATE thermal interface likewise is a proprietary paraffin-based thermal compound utilizing additives to enhance thermal conductivity and to control its response to heat and pressure.

Additionally exemplary of prior-art thermal interfaces include those disclosed in U.S. Pat. No. 5,912,805, issued on Jun. 15, 1999 to Freuler et al. and entitled THERMAL INTERFACE WITH ADHESIVE. Such patent discloses a thermal interface positionable between an electronic component and heat sink comprised of first and second generally planar substrates that are compressively bonded to one another and have a thermally-conductive material formed on the outwardly-facing opposed sides thereof. Such interface has the advantage of being adhesively bonded into position between an electronic component and heat sink such that the adhesive formed upon the thermal interface extends beyond the juncture where the interfaces interpose between the heat sink and the electronic component.

Exemplary of the processes for forming thermal interfaces according to contemporary methodology include the teachings set forth in U.S. Pat. No. 4,299,715, issued on Nov. 10, 1981 to Whitfield et al. and entitled a METHODS AND MATERIALS FOR CONDUCTING HEAT FROM ELECTRONIC COMPONENTS AND THE LIKE; U.S. Pat. No. 4,466,483, issued on Aug. 21, 1984 to Whitfield et al. and entitled METHODS AND MEANS FOR CONDUCTING HEAT FROM ELECTRONIC COMPONENTS AND THE LIKE; and U.S. Pat. No. 4,473,113, issued on Sep. 25, 1984 to Whitfield et al., and entitled METHODS AND MATERIALS FOR CONDUCTING HEAT FROM ELECTRONIC COMPONENTS AND THE LIKE, the contents of all three of which are expressly incorporated herein by reference.

In addition to the construction of thermal interfaces, there have further been advancements in the art with respect to the thermal compositions utilized for facilitating the transfer of heat across an interface. Exemplary of such compounds include those disclosed in U.S. Pat. No. 6,054,198, issued on Apr. 25, 2000 to Bunyan et al. and entitled CONFORMAL THERMAL INTERFACE MATERIAL FOR ELECTRONIC COMPONENTS, and U.S. Pat. No. 5,930,893, issued on Aug. 3, 1999 to Eaton and entitled THERMALLY CONDUCTIVE MATERIAL AND METHOD OF USING THE SAME, the teachings of which are expressly incorporated by reference.

Such compositions, along with the aforementioned pad-type thermal interfaces, however, are each intended to be applied or positioned in a flat, horizontal plane (i.e., an X/Y axis) that runs parallel between the electronic component and heat sink. As a consequence, heat must pass through such materials via a parallel horizontal plane. As is well-known, however, the ability of a material to conduct heat is typically lower across a generally parallel or horizontal cross-section of material than could be attained through the same material maintained in a generally perpendicular or vertical orientation (i.e., a Z axis).

Notwithstanding the increased thermal conductivity along the vertical axis, contemporary methodology predominately emphasizes a thermal interface construction that is as thin as possible and/or utilizes a minimal amount of layers that are present between the heat sink and electronic component. Accordingly, there has not yet been available any type of thermal interface which concomitantly possesses a thermally-conductive material or substrate disposed in a vertical orientation (i.e., perpendicular relative the electronic component and heat sink) that additionally is thin enough to optimally facilitate the transfer of heat from the electronic component to a heat sink. There is also lacking any such type of thermal interface that can be readily fabricated from well-known, thermally-conductive materials that can be readily deployed in virtually all types of heat transfer applications requiring the dissipation of heat from an electronic component to a heat sink. Still further, there is lacking any type of thermal interface of the aforementioned variety that is easy to handle and utilize, effective in filling voids between and transferring heat away from a given heat-dissipating component to a heat sink, is easy and relatively inexpensive to produce, and does not require special handling.

BRIEF SUMMARY OF THE INVENTION

The present invention specifically addresses and alleviates the aforementioned deficiencies in the art. In this regard, the present invention is directed to a thermal interface comprised of a wafer or wafer-type structure positionable between a heat sink and electronic component for facilitating the transfer of heat thereacross. The wafer is comprised of at least one strip of a thermally-conductive substrate that is maintained in a generally vertical or perpendicular orientation along a horizontal plane that, in use, is interposed between the interface mating surfaces of the electronic component and heat sink. The vertically oriented strip defines first and second sides upon at least one of which is formed a layer of conformable heat-conductive material. With respect to the latter, the same preferably comprises a phase-change material that is operative to remain solid at room temperature, but liquify or become molten when subjected to the elevated temperatures associated with the operation of the electronic component. Preferably, such heat-conductive materials will be formulated to undergo a phase change at 51° C. or higher, to thus ensure ideal mechanical contact between the electronic component and heat sink just prior to when most electronic components attain the temperature at which they are intended to operate.

The substrate will preferably comprise an elongate strip of metal foil, such as copper, gold, silver or aluminum, with aluminum being most ideal. Such substrate strip may be formed as a tightly-wound coil that assumes a generally spiral-like configuration that extends outwardly along a horizontal axis. In an alternative embodiment, the elongate strip of substrate may be formed such that the same assumes a serpentine configuration. Still further, such wafer may be comprised from a multiplicity of strips of thermally-conductive substrate with thermally-conductive material formed thereon that are arranged in elongate rows in generally parallel relation to one another. In all embodiments, however, the wafer defining the thermal interface will consist of alternating vertically or perpendicularly-oriented segments of thermally-conductive substrate and thermally-conductive material relative the electronic component and heat sink coupled therewith.

The present invention further comprises methods of fabricating the thermal interface wafers of the present invention. According to a preferred embodiment, the method comprises the initial step of providing a sheet of the thermally-conductive substrate and applying or forming a layer of heat-conductive material thereon, the latter of which preferably comprises any of a variety of known thermally-conductive materials possessing selective phase-change properties. The sheet with thermally-conductive material formed thereon is then rolled to a desired configuration such that the same defines a specified cross-sectional shape that conforms to the shape of a particular interface. For example, such sheet may be rolled such that the same assumes a generally cylindrical configuration such that a circular cross-section is defined thereby or rolled as a block such that a square or rectangular cross-sectional shape is defined thereby. Such rolled sheet of material is then sliced to a specified thickness, which preferably does not exceed 0.2", and preferably is 0.1" or less. In an optional step, such sliced wafer may be compressed horizontally or flatwise to thus make the same more durable, compact and insure better contact between the component and heat sink.

The resultant thermal interface wafer produced may then be utilized as per conventional thermal interfaces. Specifically, such wafer may be interposed directly between a heat sink and electronic component to facilitate the transfer of heat thereacross. In some applications, such wafer may be compressed further or clamped between electronic component and heat sink to ensure an ideal, secure engagement at the interface therebetween.

The present invention thus provides a thermally-conductive interface wafer that is substantially more effective than prior art interfaces in facilitating the transfer of heat away from an electronic component to a heat-dissipating component, such as a heat sink.

The present invention further provides a thermally-conductive interface wafer that can be readily fabricated from existing materials and readily deployed for use in a wide variety of thermal interface applications.

The present invention further provides a thermally-conductive interface wafer that is operative to provide a highly efficient heat transfer medium, which offers substantial economic advantages for options of eliminating costly heat-dissipating mechanisms or towards the reduction in size, weight and cost of heat sinks.

The present invention further provides a thermally-conductive interface wafer which, in use, is operative to fill voids or gaps present at the interface between the heat sink and any electronic component to ensure better mechanical contact, and hence thermal conductivity thereacross.

The present invention still further provides a method for manufacturing the novel thermally-conductive interface wafers of the present invention, as well as utilizing the same to transfer heat from a heat-dissipating component and a heat sink.

BRIEF DESCRIPTION OF THE DRAWINGS

These, as well as other features of the present invention, will become more apparent upon reference to the drawings wherein.

DETAILED DESCRIPTION OF THE INVENTION

The detailed description set forth below is intended as a description of the presently preferred embodiment of the invention, and is not intended to represent the only form in which the present invention may be constructed or utilized. The description sets forth the functions and sequences of steps for constructing and operating the invention. It is to be understood, however, that the same or equivalent functions and sequences may be accomplished by different embodiments and that they are also intended to be encompassed within the scope of the invention.

Figure 1:
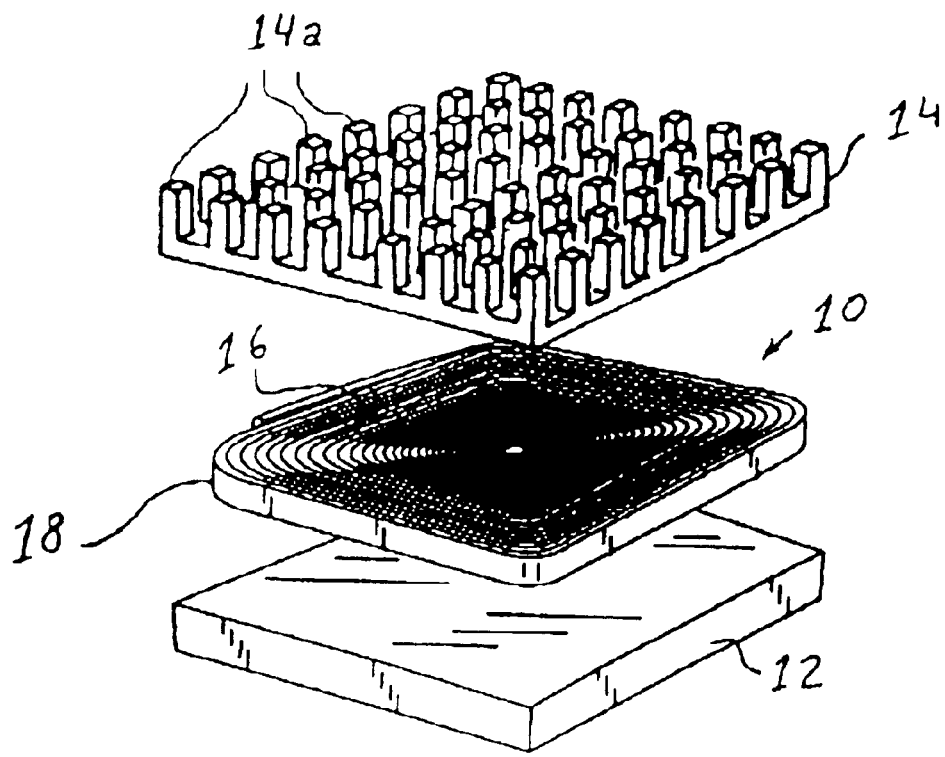
FIG. 1 is an exploded perspective view of a heat sink positioned for attachment to electronic component further showing a thermal interface wafer being disposed therebetween, the wafer being constructed in accordance with an embodiment of the present invention.

Referring now to the drawings, and initially to FIG. 1, there is shown a thermal interface 10 constructed in accordance with the present invention. The thermal interface 10 is specifically designed and configured to facilitate the transfer of heat away from an electronic component 12 to a heat sink 14. In this regard, the thermal interface 10 is specifically designed and adapted to be interposed between the electronic component 12 and heat sink 14 as per conventional interface structures and compositions. As is well known, most heat sinks such as 14, are provided with outwardly-extending structures, such as elongate members 14a, having sufficient surface area to dissipate the heat generated from the component 12, across the interface 10, and into the surrounding air. To help achieve that end, a fan or other like device (not shown) is typically deployed to facilitate adequate air circulation over such extensions 14a.

Preferably, the thermal interface 10 comprises a wafer or wafer-like structure formed to have a shape or footprint compatible with the particular electronic component and/or heat sink utilized therewith to thus enable the thermal interface 10 to meet or exceed surface area contact at the juncture between the electronic component 12 and heat sink 14. As is well-known in the art, to maximize the ability of heat to be transferred across an interface, mechanical contact is preferably maintained at all points about the juncture between the component, thermal interface, and heat sink.

Figure 2:
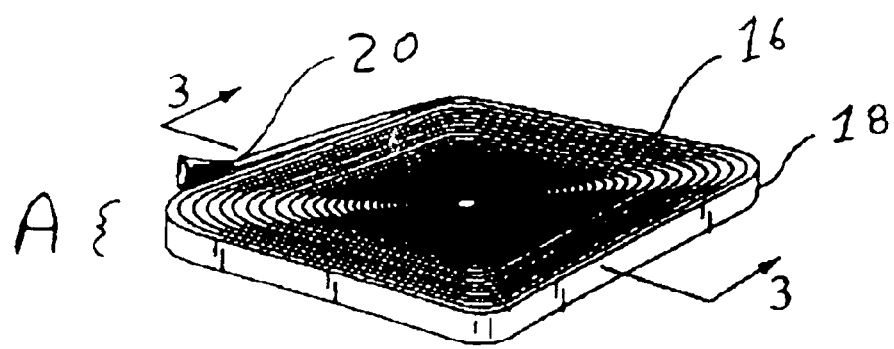
FIG. 2 is an elevated perspective view of the thermal interface wafer depicted in FIG. 1.

As shown in both FIGS. 1 and 2, the thermal interface is preferably formed from an elongate strip or substrate 18 coiled about itself in a generally spiral-like fashion along a horizontal plane. Such strip or substrate comprises a thin, malleable strip of thermally-conductive material, and preferably will comprise a metal foil having a high degree of thermal conductivity. Among the preferred metallic foils for use in the practice of the present invention include copper, gold, silver and aluminum, with aluminum being exceptionally preferred due to its low cost and high degree of thermal conductivity. Such strip will further preferably have a thickness of 2 mil or less.

Such substrate will preferably have a width, represented by the letter A in FIG. 2 of approximately 0.02" or less. Preferably, such thickness will be 0.01" or less and, according to a more highly referred embodiment, between 0.005 to 0.01". The substrate strip will further preferably have formed upon at least one respective side thereof a layer of a thermally conductive compound 20 formulated to facilitate and enhance the ability of the interface 10 to transfer heat away from the electronic component to the heat sink. Such thermally conductive compound 20 may take any of a variety of compositions well known to those skilled in the art, such as thermal grease and the like. Preferably, such layer is formulated to have selected phase-change properties such that the compositions is substantially solid at room temperature (i.e., when the electronic device is not operating), but viscous or liquid when the electronic component attains its normal operating temperature. As is well-known, becoming liquid or viscous at such elevated temperature enables the composition to fill any voids or gaps formed by surface irregularities at the interface to become filled, thereby maintaining a generally continuous mechanical contact for heat to transfer from the component, across the interface and to the heat sink. Following operation of the electronic component, the electronic component will consequently return to room temperature and a layer of thermal compound 20 will reassume its solid phase.

Preferably, the thermally conductive composition may take any of those disclosed in Applicant's co-pending patent application entitled PHASE CHANGE THERMAL INTERFACE COMPOSITION HAVING INDUCED BONDING PROPERTY, filed on Apr. 12, 2001, Ser. No. not yet assigned, and Applicant's co-pending patent application entitled GRAPHITIC ALLOTROPE INTERFACE COMPOSITION AND METHOD OF FABRICATING THE SAME, filed on May 18, 2000, and assigned application Ser. No. 09/573,508, the teachings of which are expressly incorporated herein by reference. Such thermal compounds have the desirable phase-change properties of assuming a solid phase at normal room temperature, but liquify at elevated temperatures of approximately 51° C. or higher, which is typically just below the operating temperatures at which most electronic components are intended to operate. It should be understood, however, that a wide variety of alternative thermally conductive materials and compounds are available and readily known to those skilled in the art which could be deployed for use in the practice of the present invention.

Figure 3:
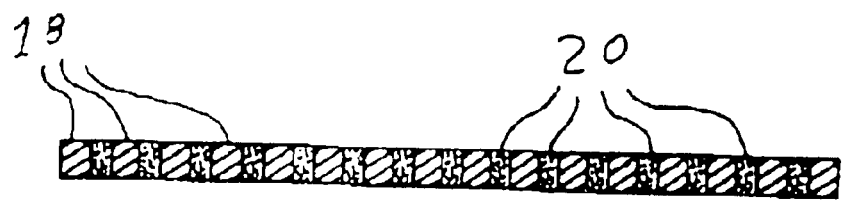
FIG. 3 is a cross-sectional view taken along the line 3—3 of FIG. 2.

When the strip-type substrate with thermally-connective material formed thereon is coiled in the manner illustrated in FIGS. 1 and 2, there is thus consequently produced a horizontally-arranged row of alternating, vertically-oriented layers of the substrate 18 and thermally-conductive composition 20, as depicted in the cross-sectional view of FIG. 3. In use, when interposed between the heat sink and electronic component, the interface wafer will be operatively maintained such that the strip 18 and thermally-conductive composition 20 assume the alternating, generally vertical orientation that will be perpendicular relative the heat sink and electronic component compressed thereagainst. As will be appreciated, in alternative configurations whereby the electronic component and heat sink are maintained in a generally vertical orientation, the strip 18 and thermally-conductive composition 20 will assume an alternating, generally horizontal orientation that will be perpendicular relative the electronic component/heat sink interface.

As will be appreciated by those skilled in the art, such structure is a dramatic departure from prior art interface design which typically deploys generally planar interfaces of thermally-conductive materials that are applied as flat, horizontal substrates, layers or films. Quite advantageously, however, the vertical orientation of the substrate relative the electronic component and heat sink, coupled with the vertically-oriented layers of thermally-conductive compound disposed therebetween causes the wafer-like interface to greatly facilitate heat transfer. In this respect, presently it has been determined that an interface wafer having an approximate width of 0.01" comprised of a 2 mil thick aluminum foil substrate is capable of producing a thermal conductivity of approximately 1.3 W/in° C. or 51.2 W/m° K, which, as will be appreciated in the art, is substantially greater than most currently available interfaces and materials.

Although depicted in FIGS. 1 and 2 as a coiled-type structure, it will be recognized that the strip of substrate having the thermally-conductive material formed thereon may be shaped and formed to take any of a variety of configurations which will consequently produce the desired alternating, vertically-disposed cross-sectional pattern depicted in FIG. 3. For example, although not shown such strip with thermally-conductive compound formed thereon may be formed to assume a generally serpentine configuration or, alternatively, may simply comprise a plurality of elongate substrate strips that are arranged in generally parallel relation to one another along a common horizontal plane. With respect to the latter configuration, it is contemplated that such multiplicity of substrate strips will be compressed to one another to thus assume the cross-sectional configuration depicted in FIG. 3. Accordingly, it will be recognized that any manner by which the thermally-conductive strip with thermally-conductive composition formed thereon can assume and maintain a general vertical orientation that is perpendicular to the heat sink and electronic component will accomplish the objectives of the present invention.

Figure 5:
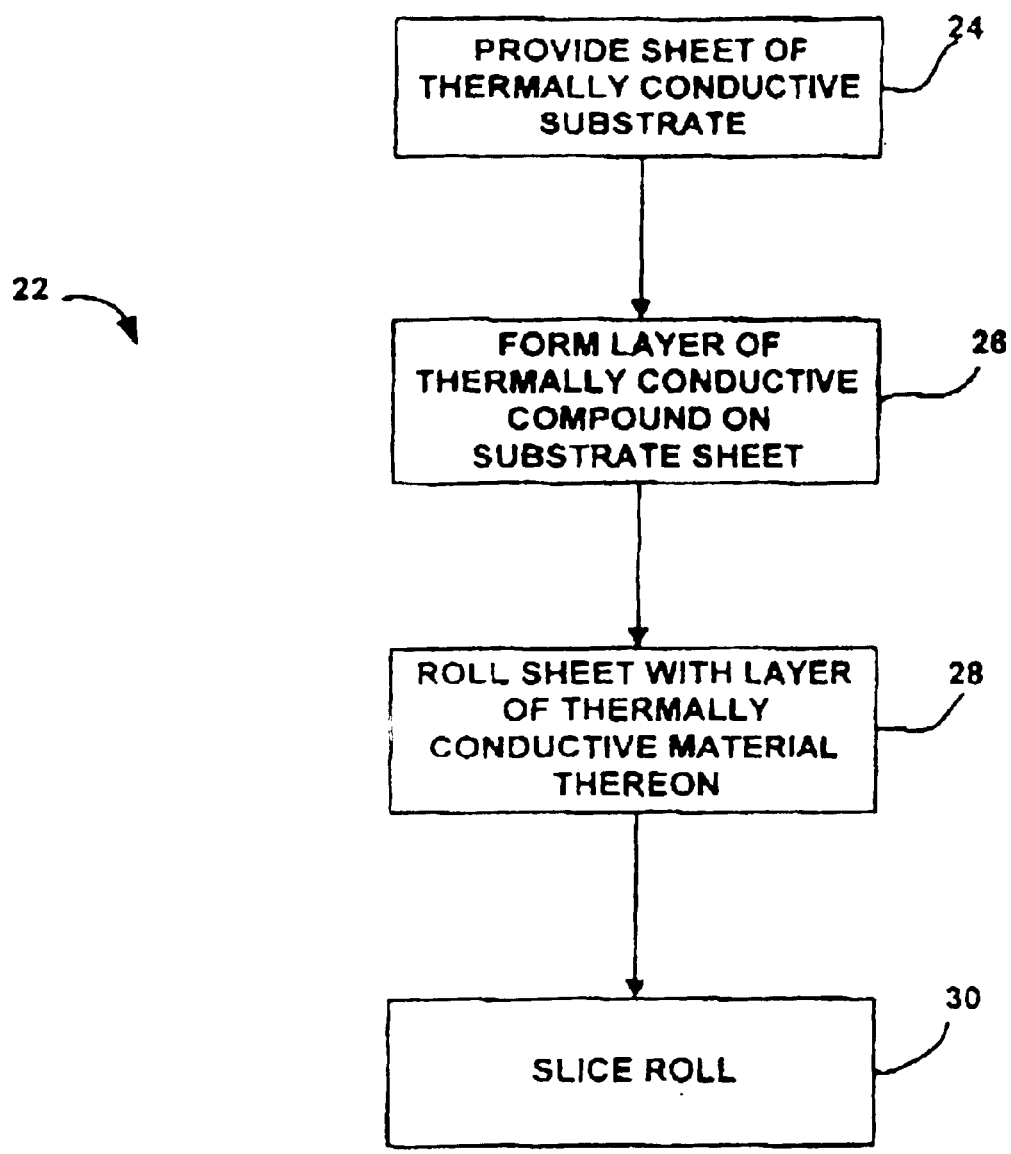
FIG. 5 is a flow chart diagram illustrating the steps for fabricating the thermal interface wafers of the present invention.

With respect to the manner by which the wafer-type interfaces of the present invention may be fabricated, there is depicted in FIG. 5 a flow chart of the steps of a method 22 to form the same. Initially, there is provided a sheet of the thermally-conductive substrate 24 which, as discussed above, will preferably comprise a metal foil. The layer of thermally-conductive material is then formed upon a respective side of the sheet, via step 26. The sheet with thermally-conductive material formed thereon is then tightly rolled via step 28. The resultant roll is then sliced 30 to a specified thickness to produce the resultant thermal interface wafer.

Figure 4:
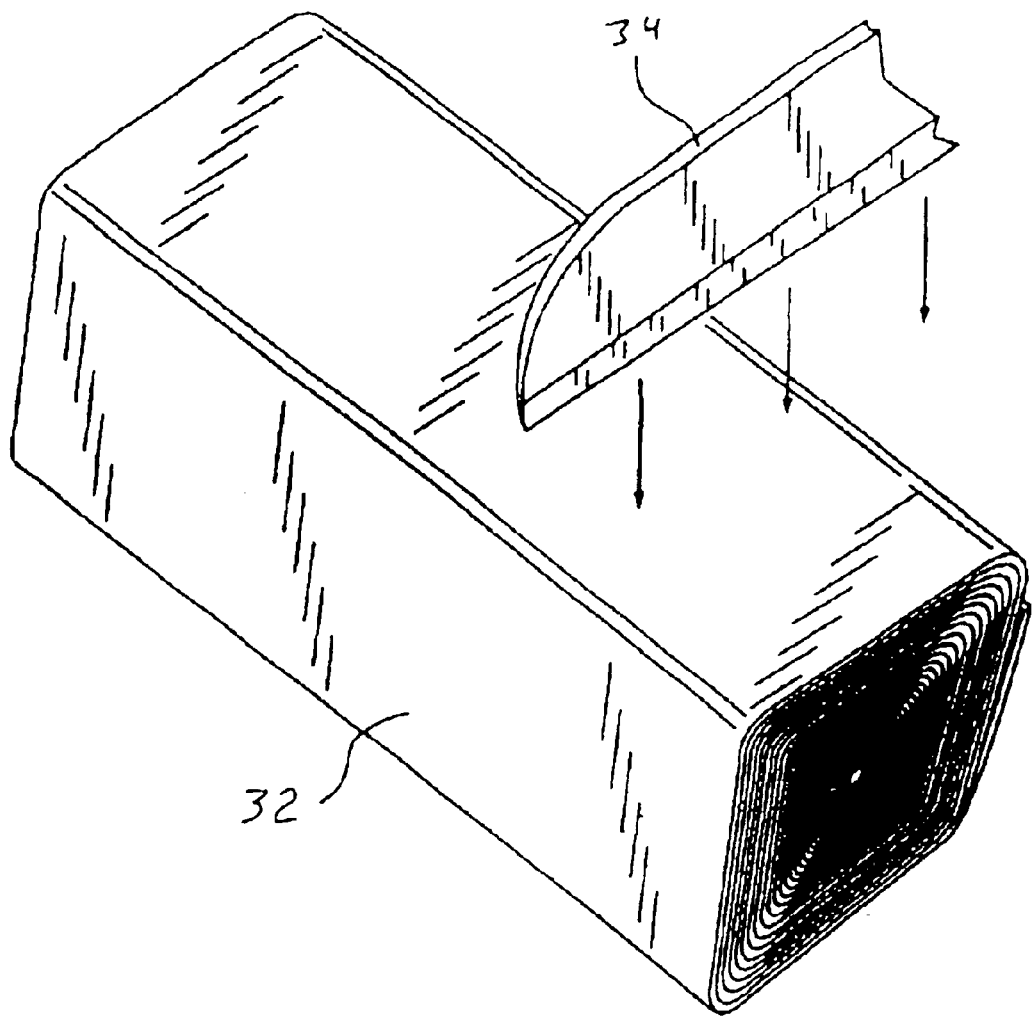
FIG. 4 is a perspective view of a rolled sheet of a thermally-conductive substrate with a layer of heat-conformable material formed thereon, the rolled sheet being oriented for cross-sectional slicing therethrough.

With respect to the latter step, there is perspectively illustrated in FIG. 4 the contemplated manner by which a rolled sheet 32 of substrate with thermally-conductive material formed thereon will be configured and oriented in order to be cut, via knife blade 34, to produce the thermal interface wafers of the present invention. It will be readily recognized, however, that such roll can be cut through such methods as sawing, grinding, and possibly laser cutting. Other methods known in the art my also be utilized. Along these lines, it is contemplated that the substrate sheet with thermally-conductive compound formed thereon 32 may be selectively rolled such that the cross-sectional cuts made therethrough will attain not only the desired thickness, but surface area sufficient to facilitate the conduction of heat across a given interface between electronic component and heat sink. For example, it is contemplated that the substrate sheet may be rolled to assume a generally cylindrical configuration, such that a circular cross-section is defined thereby, or rolled to assume a block form, to thus form a rectangular or square-like cross section as shown.

As discussed above, the wafers produced by slicing the rolled substrate sheet will preferably be such that the wafers have a thickness of 0.2" or less, and preferably 0.1" or less. It is further contemplated that in order to minimize thickness of the wafer, as well as the upper and lower surfaces thereof for interposition between a heat sink and electronic component, the resultant wafer may be compressed or flattened further by applying a horizontal or flatwise (i.e., along an X/Y axis) compressive force of approximately one hundred pounds per square inch or less thereto. Alternatively, such wafer may be simply clamped into position between the heat sink and electronic component to help ensure ideal mechanical contact between the electronic component and heat sink. Otherwise, it is contemplated that the thermal interface may be utilized as per conventional thermal interfaces whereby the same is simply interposed between the heat sink and the electronic component with the electronic component being allowed to operate as normally intended. As discussed above, due to the vertical orientation of the substrate with heat conformable material, there will thus advantageously be provided superior thermal conduction.

Additional modifications and improvements of the present invention may also be apparent to those of ordinary skill in the art. Thus, the particular combination of parts and steps described and illustrated herein is intended to represent only certain embodiments of the present invention, and is not intended to serve as limitations or alternative devices and methods within the spirit and scope of the invention.

What is claimed is:

1. A method for facilitating the transfer of heat from an electronic component to a heat sink across an interface therebetween, the method comprising the steps:
    a) providing a thermal interface wafer interposable between said electronic component and said heat sink, said water comprising at least one elongate vertically-oriented strip substrate having first and second surfaces, said substrate having at least one layer of a phase-change, heat-conductive material formed upon a respective surface thereof, said heat-conductive material being formulated to enhance the heat transfer from said electronic component to said heat sink;
    b) interposing the thermal interface wafer of step a) between said electronic component and said heat sink such that the substrate of such wafer assumes a substantially perpendicular orientation relative said electronic component and said heat sink;
    c) compressively engaging said electronic component to said heat sink with said thermal interface disposed therebetween; and
    d) operating said electronic component such that heat is generated thereby, said heat being sufficient to cause said phase-change, heat-conductive material in step a) to transition from a solid phase to a liquid phase.

2. The method for facilitating the transfer of heat of claim 1 wherein in step (a), said substrate comprises a thermally conductive metal foil.

3. The method of claim 2 wherein said foil is formed from the group consisting of copper, gold, silver and aluminum.

4. The method of claim 1 wherein said layer of conformable, heat-conducting material is formulated to have a melting point of approximately 51° C.

5. The method of claim 1 wherein in step a), said thermal interface wafer has a generally rectangular configuration.

6. The method of claim 1 wherein in step a), said thermal interface wafer has a generally square configuration.

* * * * *